(12) United States Patent
Choi

(10) Patent No.: US 8,780,099 B2
(45) Date of Patent: Jul. 15, 2014

(54) ORGANIC LIGHT EMITTING DIODE DISPLAY AND METHOD OF MANUFACTURING THE SAME

(75) Inventor: Jung-Mi Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 496 days.

(21) Appl. No.: 13/064,500

(22) Filed: Mar. 29, 2011

(65) Prior Publication Data

US 2012/0092313 A1    Apr. 19, 2012

(30) Foreign Application Priority Data

Oct. 15, 2010  (KR) .................. 10-2010-0101055

(51) Int. Cl.
G09G 3/30    (2006.01)
(52) U.S. Cl.
USPC .......................................... 345/206; 438/206
(58) Field of Classification Search
USPC .......................................... 345/206; 315/169
See application file for complete search history.

(56) References Cited

U.S. PATENT DOCUMENTS

2004/0191566 A1* 9/2004 Kikuchi et al. ............... 428/690
2007/0170850 A1* 7/2007 Choi et al. .................... 313/506

FOREIGN PATENT DOCUMENTS

| JP | 2009-283242 | 12/2009 |
|---|---|---|
| KR | 10-2006-0031590 A | 4/2006 |
| KR | 10-2007-0103204 A | 10/2007 |
| KR | 10-2008-0092848 A | 10/2008 |

* cited by examiner

Primary Examiner — Claire X Pappas
Assistant Examiner — Sepideh Ghafari
(74) Attorney, Agent, or Firm — Lee & Morse, P.C.

(57) ABSTRACT

An organic light emitting diode (OLED) display and a method of manufacturing the same are provided. The OLED display includes: a first substrate; a second substrate; a thin film transistor and a driving driver on the first substrate; an organic light emitting element including a pixel electrode, an organic emission layer, and a common electrode; a pixel defining layer; a thermal conductive layer covering the driving driver; and a first sealant along an outer edge of the first substrate and the second substrate.

18 Claims, 4 Drawing Sheets

ORGANIC LIGHT EMITTING DIODE DISPLAY AND METHOD OF MANUFACTURING THE SAME

BACKGROUND

1. Field

Embodiments relate to an organic light emitting diode (OLED) display and a method of manufacturing the same. More particularly, the embodiments relate to an OLED display and a method of manufacturing the same that can stabilize the OLED display operations. The stabilizing operations may occur, despite long term driving of a panel.

2. Description of the Related Art

An OLED display has self-luminance characteristics. Therefore, the OLED display does not require an additional light source. Thus, the OLED display may be manufactured with a small thickness and weight. OLED displays have been in the spotlight as a potential next generation display device because OLED displays represent high quality characteristics. These high quality characteristics may include low power consumption, high luminance, and a high reaction speed.

The OLED display includes an organic light emitting element and a thin film transistor for driving the OLED display. A pixel defining layer (PDL) defines a pixel area. The PDL is formed on the thin film transistor. An organic light emitting element is formed in a pixel area. The pixel area is formed between the PDL. The organic light emitting element includes an anode, a cathode, and an organic emission layer. Holes and electrons are injected from the anode and the cathode to form excitons. The excitons emit light while transiting to a ground state.

The information disclosed in the Background is only for an enhanced understanding of the described technology. Therefore, it may contain information that does not form the prior art already known to a person of ordinary skill in the art in this country.

SUMMARY

Embodiments are directed to an OLED display and a method of manufacturing the OLED display.

An exemplary embodiment provides an OLED display including: a first substrate; a second substrate facing the first substrate; a thin film transistor on the first substrate in a display area; a driving driver on the first substrate in a non-display area; an organic light emitting element on the thin film transistor and including a pixel electrode, an organic emission layer, and a common electrode; a PDL on the thin film transistor and exposing a part of the pixel electrode; a thermal conductive layer covering the driving driver; and a first sealant between the first substrate and the second substrate, the first sealant along an outer edge of the first substrate and the second substrate.

The thermal conductive layer and the PDL may be made of same material.

The common electrode may cover the PDL.

The OLED display may further include a second sealant covering the common electrode and the thermal conductive layer between the first substrate and the second substrate.

The common electrode may cover the PDL and the thermal conductive layer.

The OLED display may further include a second sealant covering the common electrode, the second sealant between the first substrate and the second substrate.

The second sealant may include an epoxy resin and a metal oxide, and the metal oxide may be an oxide of any one of copper (Cu), aluminum (Al), silver (Ag), and iron (Fe).

The second sealant may include an epoxy resin and talc.

The first sealant may include an epoxy resin.

The second substrate may be made of glass or metal.

Another embodiment provides a method of manufacturing an OLED display, the method including: forming a thin film transistor and a driving driver on a first substrate; forming a pixel electrode on the thin film transistor; forming a heat conductive layer that covers the driving driver and a PDL that exposes a part of the pixel electrode on the thin film transistor; forming an organic emission layer on the pixel electrode; forming a common electrode to cover the PDL and the organic emission layer; applying a first sealant along an outer edge of the first substrate; and bonding the first substrate and a second substrate through the first sealant.

The thermal conductive layer and the PDL may be simultaneously made of same material.

The method may further include applying a second sealant after applying the first sealant, the second sealant covering the common electrode and the thermal conductive layer.

The common electrode may be formed to cover the thermal conductive layer.

The method may further include applying a second sealant after applying the first sealant, the second sealant covering the common electrode.

The second sealant may include an epoxy, and may further include talc or a metal oxide, which is an oxide of any one of copper (Cu), aluminum (Al), silver (Ag), and iron (Fe).

The method may further include thermosetting the second sealant.

The first sealant may include an epoxy resin.

The method may further include ultraviolet (UV) curing the first sealant.

The second substrate may be made of glass or metal.

DETAILED DESCRIPTION

Figure 1:
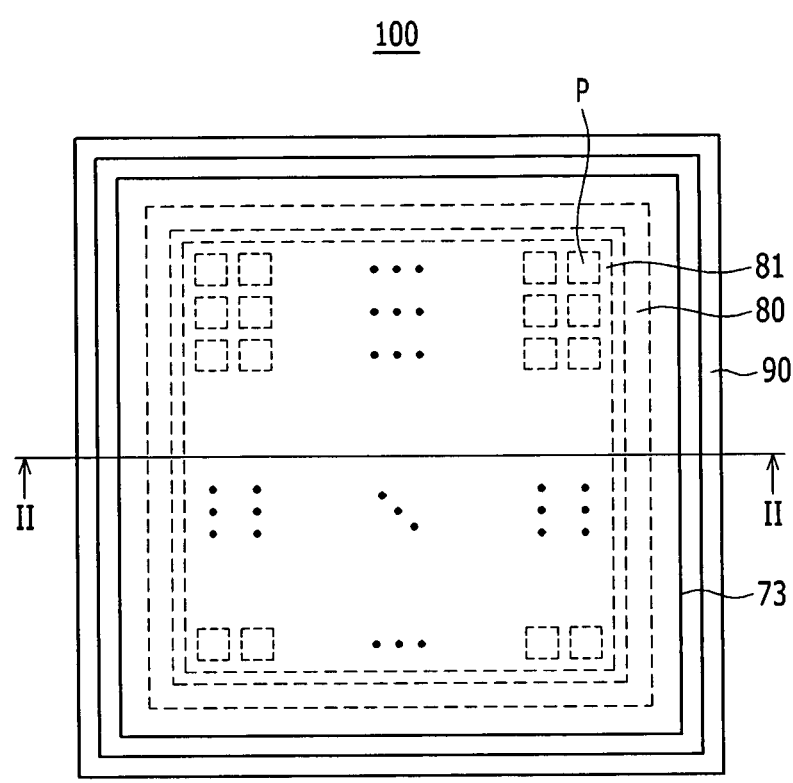
FIG. 1 is a schematic top plan view illustrating an OLED display according to a first exemplary embodiment.

Korean Patent Application No. 10-2010-0101055, filed on Oct. 15, 2010, in the Korean Intellectual Property Office, and entitled: "Organic Light Emitting Diode Display and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the inventive concept to those skilled in the art.

Accordingly, the drawings and description are to be regarded as illustrative in nature, and not restrictive. In the drawings, the size and thickness of each element are randomly represented for better understanding and ease of description, and the inventive concept is not limited thereto. Furthermore, like reference numerals designate like elements throughout the specification and the drawings.

When it is said that elements such as a layer or a film is positioned on another element, it means the element is directly on the other element or above the other element with at least one intermediate element.

Figure 2:
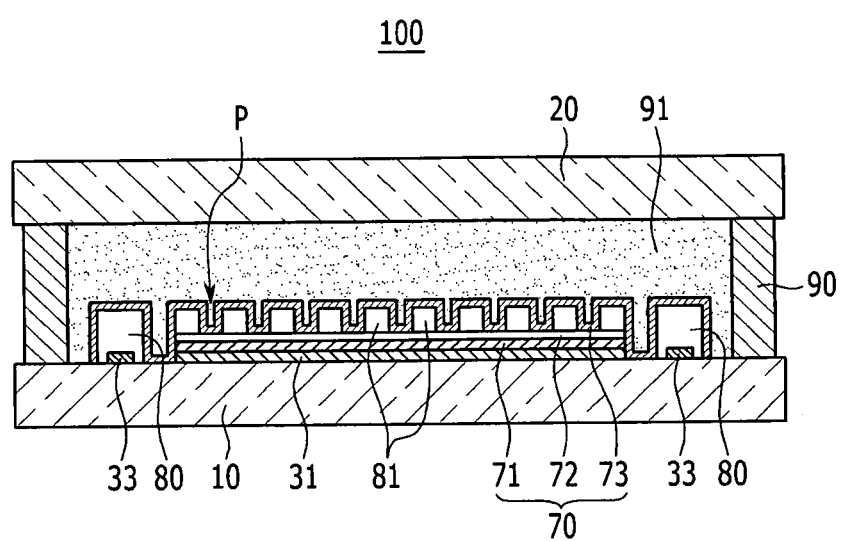
FIG. 2 is a schematic cross-sectional view illustrating the OLED display taken along line II-II of FIG. 1.

FIG. 1 is a schematic top plan view illustrating an organic light emitting diode (OLED) display according to a first exemplary embodiment. FIG. 2 is a schematic cross-sectional view illustrating the OLED display taken along line II-II of FIG. 1.

Referring to FIGS. 1-2, an OLED display 100, according to the present embodiments, includes a display substrate 10 (e.g., first substrate), an encapsulation substrate 20 (e.g., second substrate) facing the display substrate 10, a first sealant 90, a driving driver 33, a thin film transistor 31, and an organic light emitting element 70. The first sealant 90 is used for cohering the display substrate 10 and the encapsulation substrate 20. The organic light emitting element 70 is formed on the display substrate 10. A pixel defining layer (PDL) 81 is formed on the thin film transistor 31 to define a pixel area P.

The OLED display 100 is divided into a display area that displays an image, and a non-display area for circuit wiring, etc. In the present embodiments, the display area is formed in the central part of the OLED display 100, and the non-display area is formed to enclose the display area at an outer edge portion of the OLED display 100. The pixel area P is formed in a predetermined pattern within the display area to emit light. Light is emitted by driving the organic light emitting element 70 through the thin film transistor 31.

The organic light emitting element 70 includes a pixel electrode 71, an organic emission layer 72, and a common electrode 73. The pixel electrode 71 is connected to the thin film transistor 31. The organic emission layer 72 is formed on the pixel electrode 71. The common electrode 73 is formed on the organic emission layer 72. In the present embodiments, the pixel electrode 71 is a positive electrode, i.e. a hole injection electrode. The common electrode 73 is a negative electrode, i.e. an electron injection electrode. However, the present embodiments are not limited thereto. The pixel electrode 71 may be a negative electrode and the common electrode 73 may be a positive electrode. The common electrode 73 is formed to cover the PDL 81 and the organic emission layer 72.

The driving driver 33 is formed in the non-display area of the OLED display 100. The driving driver 33 may be formed in the display substrate 10 or may be mounted on the display substrate 10. The driving driver 33 is used for driving the thin film transistor 31.

A heat conductive layer 80 is formed on the driving driver 33. The heat conductive layer 80 is formed to cover the driving driver 33. Covering the driving driver 33 protects the driving driver 33 from an external factor. Protecting the driving driver 33 may suppress a driving failure of the driving driver 33. The heat conductive layer 80 transfers heat generated in the driving driver 33 to a second sealant 91. Thus, heat generated in the driving driver 33 gets emitted to the outside.

The heat conductive layer 80 is made of same material as that of the PDL 81. A process of forming the PDL 81 can be used in the process of forming the heat conductive layer 80. Thus, the OLED display 100, according to the present embodiments may be manufactured with a simple change in the manufacturing process.

In the present embodiments, the common electrode 73 is formed to cover the heat conductive layer 80 and the PDL 81. Therefore, the common electrode 73 protects the driving driver 33 together with the heat conductive layer 80. The driving driver 33 together with the heat conductive layer 80 is protected from an external factor, e.g., moisture and oxygen. Thus, the lifespan of the driving driver 33 is improved. In this scenario, penetration of moisture, etc., has a greater influence in the horizontal direction than the vertical direction. The horizontal direction is a viewing direction of the first sealant 90. The vertical direction is an opposite direction to both substrates 10 and 20. Thus, it is preferable for the common electrode 73 to cover up a side surface of the heat conductive layer 80.

The first sealant 90 is formed with an epoxy resin. More specifically, the epoxy resin has ultraviolet (UV) curing characteristics. The first sealant 90 bonds the display substrate 10 and the encapsulation substrate 20. The first sealant 90 prevents penetration of external moisture and oxygen. The first sealant 90 also bonds substrates 10 and 20 together.

In the present embodiments, the second sealant 91 is formed between the display substrate 10 and the encapsulation substrate 20. Referring to FIG. 2, the second sealant 91 is entirely formed in a space between the display substrate 10 and the encapsulation substrate 20. The second sealant 90 covers the common electrode 73. The common electrode is formed on the heat conductive layer 80 and the PDL 81.

The second sealant 91 is made of a material having high thermal conductivity. The second sealant 91 may be an epoxy resin and a material having a high thermal conductivity, e.g., talc or a metal oxide. The metal oxide may be an aluminum oxide ($Al_2O_3$), or may be an oxide of any one of copper (Cu), silver (Ag), and iron (Fe). Unlike the first sealant 90, the second sealant 91 epoxy resin is formed as an epoxy resin having thermosetting characteristics. However, the present embodiments are not limited thereto. The second sealant 91 may be made of various materials having high thermal conductivity.

The second sealant 91 is made of a material having high thermal conductivity. The second sealant 91 quickly disperses heat generated in the driving driver 33, the thin film transistor 31, and the organic light emitting element 70 to the encapsulation substrate 20 and the first sealant 90. Thus, heat dissipation efficiency to the outside is improved. Heat generated within the OLED display increases according to an increase in the area of the OLED display. Thus, the internal temperature of the OLED display can be suppressed. The second sealant 91 suppresses the internal temperature of the OLED display from increasing.

When the second sealant 91 is formed of an epoxy resin having good adhesive strength, bonding can be securely performed between the display substrate 10 and the encapsulation substrate 20 together with the first sealant 90.

The second sealant 91 has relatively lower water vapor transmission rate (WVTR) characteristics than the first sealant 90. Lower WVTR characteristics may suppress moisture from penetrating to the organic light emitting element 70.

In the present embodiments, the encapsulation substrate 20 is made of glass or metal. In the present embodiment, the OLED display 100 is formed as a rear light emitting type that emits light through the display substrate 10. Heat is transferred to the second sealant 91. Thus, in order to efficiently emit heat to the outside, the encapsulation substrate 20 is made of a metal having high thermal conductivity. The encapsulation substrate 20 is made of a transparent material in a front light emitting type or both surface light emitting type OLED display that emits light through the encapsulation substrate 20. The transparent material may be glass.

Figure 3:
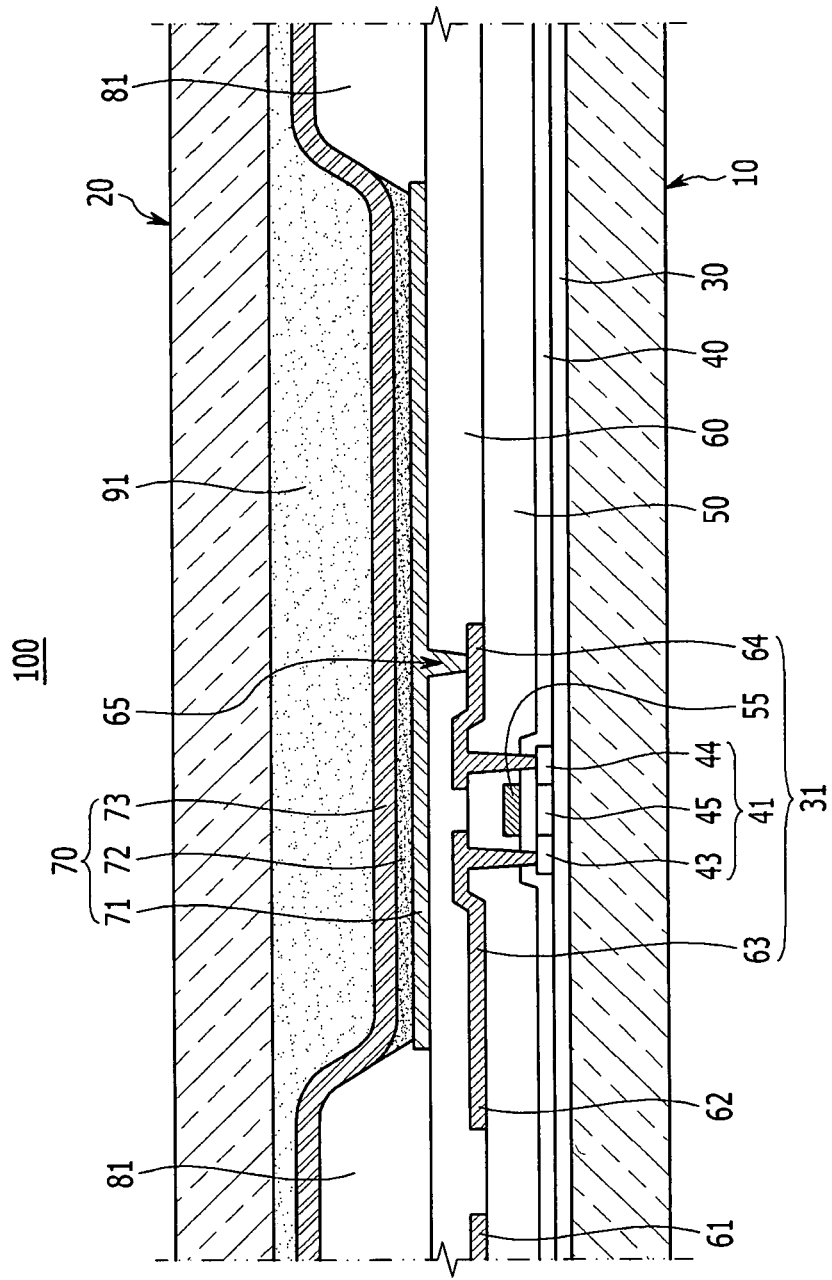
FIG. 3 is an enlarged cross-sectional view illustrating a pixel area of an OLED display according to a first exemplary embodiment.

FIG. 3 is an enlarged cross-sectional view illustrating a pixel area of an OLED display according to a first exemplary embodiment.

A buffer layer 30 is formed on the display substrate 10. The buffer layer 30 is made of an insulation material, e.g. glass. The buffer layer 30 is made of silicon nitride ($SiN_x$), silicon oxide ($SiO_x$), silicon oxynitride ($SiO_xN_y$), etc. The buffer layer 30 may be omitted according to the material and the process condition of the display substrate 10. A semiconductor layer 41 is formed on the buffer layer 30. The semiconductor layer 41 includes a channel area 45, in which impurities are not doped. The semiconductor layer 41 includes a source area 43 and a drain area 44, doped with a p+ impurity at both sides of the channel area 45. In this scenario, a doped ion material is a P-type impurity, e.g. boron (B).

In the present embodiment, the thin film transistor 31 uses a thin film transistor of a PMOS structure with a P-type impurity. However, the present embodiments are not limited thereto. The thin film transistor may use a thin film transistor of an NMOS structure or a CMOS structure. In the present exemplary embodiment, the thin film transistor 31 is a polycrystal thin film transistor including a polysilicon film. However, the thin film transistor 31 may be an amorphous thin film transistor, including an amorphous silicon film.

A gate insulating layer 40, is formed on the semiconductor layer 41. The gate insulating layer is made of silicon nitride, silicon oxide, etc. A gate wire, including a gate electrode 55, is formed on the gate insulating layer 40. The gate wire includes a gate line, a first capacitor plate, and other wires. The gate electrode 55 is formed to overlap with at least a part of the semiconductor layer 41, e.g., on the channel area 45 of the semiconductor layer 41. An insulating layer dielectric 50 covers the gate electrode 55. The insulating layer dielectric 50 is formed on the gate insulating layer 40. A hole is formed in the gate insulating layer 40 and the insulating layer dielectric 50. The hole exposes the source area 43 and the drain area 44 of the semiconductor layer 41. The insulating layer dielectric 50 is similar to the gate insulating layer 40, in that the insulating layer dielectric 50 may be made of silicon nitride, silicon oxide, etc. A data wire, including a source electrode 63 and a drain electrode 64, is formed on the insulating layer dielectric 50. The data wire includes a data line 61, a common power source line 62, a second capacitor plate, and other wires. The source electrode 63 and the drain electrode 64 are connected to the source area 43 and the drain area 44 of the semiconductor layer 41. The connection of the source electrode 63 and the drain electrode 64 to the source area 43 and the drain area 44 of the semiconductor layer 41 occurs through a hole formed in the insulating layer dielectric 50 and the gate insulating layer 40, respectively.

In the present embodiment, the thin film transistor 31 is formed. The thin film transistor 31 includes the semiconductor layer 41, the gate electrode 55, the source electrode 63, and the drain electrode 64 of the above-described structure. A configuration of the thin film transistor 31 is not limited to the above-described example. The configuration of the thin film transistor 31 may be variously changed by a person of ordinary skill in the art.

A planarization layer 60, covering a data wire, is formed on the insulating layer dielectric 50. A contact hole 65 is formed in the planarization layer 60. The contact hole 65 exposes a part of the drain electrode 64. Either the insulating layer dielectric 50 or the planarization layer 60 may be omitted.

The pixel electrode 71 of the organic light emitting element 70 is formed on the planarization layer 60. The pixel electrode 71 is connected to the drain electrode 64 through the contact hole 65. The PDL 81, having a plurality of openings that expose each pixel electrode 71, is formed on the planarization layer 60. A portion of the PDL 81 serves as a non-light emitting area. An opening in the PDL 81 serves as a light emitting area, i.e., a pixel area P. The PDL 81 is made of a resin, e.g. a polyacrylate resin and a polyimide resin, or a silica-based inorganic material. The heat conductive layer 80 is made of the same material as the PDL 81.

The organic emission layer 72 is formed on the pixel electrode 71. The common electrode 73 is formed on the organic emission layer 72. Therefore, the organic light emitting element 70 is formed. The organic emission layer 72 is made of a low polymer organic material or a high polymer organic material. The organic emission layer 72 may be formed as a multiple film, e.g. at least one of a hole injection layer (HIL), a hole transporting layer (HTL), an electron transporting layer (ETL), and an electron injection layer (EIL).

The encapsulation substrate 20, for sealing the organic light emitting element 70, is formed on the common electrode 73. The second sealant 91 is formed between the organic light emitting element 70 and the encapsulation substrate 20.

The OLED display 100, according to the present embodiment, is formed as a rear light emitting type. The pixel electrode 71 is formed as a transparent electrode. The transparent electrode may include indium tin oxide (ITO) or indium zinc oxide (IZO). The encapsulation substrate 20 is made of a material having an excellent heat dissipation function, e.g. a metal. When the OLED display 100 is formed as a front light emitting type or a both surface light emitting type, the common electrode 73 is formed as a transparent electrode. The transparent electrode may include ITO and IZO. The encapsulation substrate 20 is also made of glass or a transparent material.

As the OLED display 100, according to the present embodiment, forms the heat conductive layer 80 to cover the driving driver 33, a driving failure is suppressed and heat dissipation characteristics are improved. By forming the heat conductive layer 80 with the same material as that of the PDL 81, the manufacturing process of the OLED display 100 may be simplified.

By forming the second sealant 91 to cover the front surface of the common electrode 73 of the organic light emitting element 70, bonding of both substrates 10 and 20 can be more securely performed. In addition, heat generated within the OLED display 100 can be efficiently emitted. The organic light emitting element 70 covers the PDL 81 and the heat conductive layer 80 between the display substrate 10 and the encapsulation substrate 20.

Referring again to FIGS. 1-3, a method of manufacturing the OLED display 100 according to a first exemplary embodiment will be described.

In order to manufacture the OLED display 100 according to the present exemplary embodiment, the thin film transistor 31 and the driving driver 33 are formed in a display area and a non-display area, respectively. The thin film transistor 31 and the driving driver 33 are formed on the display substrate 10. The pixel electrode 71 is formed on the thin film transistor 31. Thereafter, the PDL 81 is formed to expose a part of the pixel electrode 71 on the thin film transistor 31. The heat conductive layer 80 is formed to cover the PDL 81 on the driving driver 33. In this scenario, the heat conductive layer 80 is made of the same material as the PDL 81. Therefore, by modifying an opening pattern of a mask for patterning the PDL 81, the heat conductive layer 80 and the PDL 81 may be simultaneously formed.

After the PDL 81 and the heat conductive layer 80 are formed, the organic emission layer 72 is formed on the pixel electrode 71. The common electrode 73 is formed on the organic emission layer 72. In the present embodiment, the common electrode 73 is formed to cover the organic emission layer 72 and the PDL 81. The common electrode 73 also covers the heat conductive layer 80 formed on the driving driver 33. Thus, the driving driver 33 is protected from an external factor. The lifespan of the driving driver 33 is also improved.

The OLED display 100, according to the present embodiment, is formed as a front light emitting type that emits light in a direction of the display substrate 10. The pixel electrode 71 is formed as a transparent electrode, e.g. including ITO and IZO. However, the present embodiments are not limited thereto. The present embodiments may be formed as a rear light emitting type or a both surface light emitting type. When the OLED display 100 is formed as a rear light emitting type, the common electrode 73 is formed as a transparent electrode, e.g. including ITO and IZO. When the OLED display 100 is formed as a both surface light emitting type, the pixel electrode 71 and the common electrode 73 are formed as transparent electrodes.

The first sealant 90 is applied along an outer edge of the display substrate 10. The first sealant 90 is made of an epoxy resin, e.g. an epoxy resin having UV curing characteristics.

After the first sealant 90 is applied, the second sealant 91 is applied to cover the common electrode 73. The second sealant 91 is formed with a material having high thermal conductivity. The second sealant 91 is formed by a material having high thermal conductivity in an epoxy resin, e.g., talc or a metal oxide. In this scenario, the metal oxide may be an aluminum oxide ($Al_2O_3$), or may be an oxide of any one of copper (Cu), silver (Ag), and iron (Fe). An epoxy resin of the second sealant 91 may be an epoxy resin having thermosetting characteristics. However, the present embodiments are not limited thereto. The second sealant 91 may be made of various materials having high thermal conductivity.

When the second sealant 91 is formed, the display substrate 10 and the encapsulation substrate 20 with the first sealant 90 can be securely cohered together. As the second sealant 91 is made of a material having high thermal conductivity, heat generated within the OLED display 100 is quickly dispersed. Thus, heat dissipation efficiency to the outside is improved. As the second sealant 91 is formed to have low vapor transmittance, moisture permeation into the organic light emitting element 70 may be suppressed.

After the first sealant 90 and the second sealant 91 are applied, the encapsulation substrate 20 is bonded to the display substrate 10 through the sealants. As in the present embodiments, when the OLED display 100 is a front light emitting type, the encapsulation substrate 20 is made of a metal having high thermal conductivity. The choice of metal will be made in consideration of a heat dissipation function. When the OLED display 100 is a rear light emitting type or both surface light emitting type, the encapsulation substrate 20 is made of a transparent material, e.g. glass.

After the encapsulation substrate 20 is bonded through the first sealant 90 and the second sealant 91, the first sealant 90 and the second sealant 91 are cured. Since the first sealant 90 has UV curing characteristics, the first sealant 90 is cured by applying UV. Since the second sealant 91 has thermosetting characteristics, the second sealant 91 is cured by applying heat. However, the present embodiments are not limited thereto. By allowing the first sealant 90 and the second sealant 91 to have the same curing characteristics, the first sealant 90 and the second sealant 91 may be cured using one of UV radiation and heating.

The OLED display 100, according to the present embodiments, forms the heat conductive layer 80 and the second sealant 91. Thus, heat dissipation characteristics are improved. In addition, protection characteristics of the OLED display 100, against penetration of moisture, etc., are also improved. The heat conductive layer 80 may be made of the same material as that of the PDL 81. The heat conductive layer 80 may be formed through a simple process of changing a mask opening pattern. The process of changing a mask opening pattern occurs during formation of the PDL 81.

Figure 4:
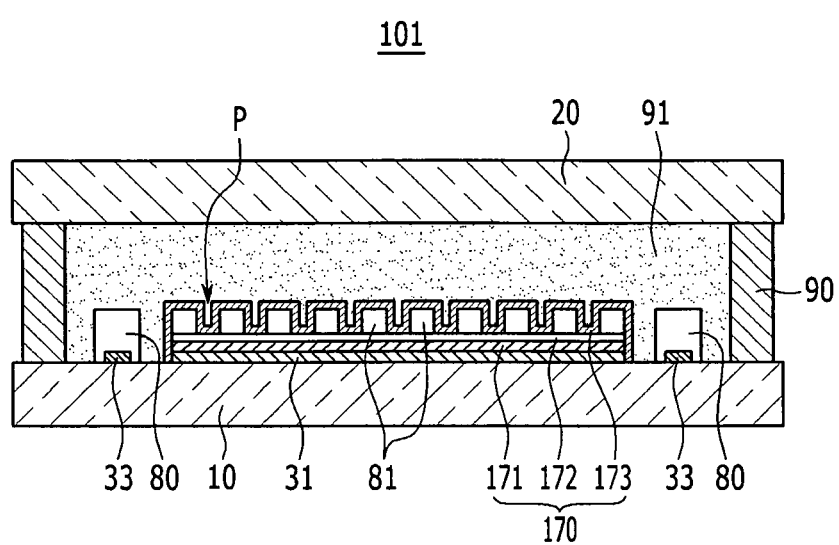
FIG. 4 is a schematic cross-sectional view illustrating an OLED display according to a second exemplary embodiment.

FIG. 4 is a cross-sectional view illustrating an OLED display according to a second exemplary embodiment. Hereinafter, the second exemplary embodiment will be described with reference to FIG. 4. When describing the second exemplary embodiment, the same configuration as that of the first exemplary embodiment will be briefly described or omitted.

An OLED display 101, according to the present exemplary embodiment, includes the display substrate 10, the encapsulation substrate 20 facing the display substrate 10, the first sealant 90, the driving driver 33, the thin film transistor 31, the PDL 81, and an organic light emitting element 170. The first sealant 90 is used to adhere the display substrate 10 and the encapsulation substrate 20 together. The driving driver 33 is formed on the display substrate 10. The OLED display 101 further include the heat conductive layer 80 formed on the driving driver 33, and the second sealant 91. The second sealant 91 is entirely formed in a space between the display substrate 10 and the encapsulation substrate 20.

The organic light emitting element 170, according to the present exemplary embodiment, includes a pixel electrode 171, an organic emission layer 172, and a common electrode 173. The common electrode 173 is formed to cover the organic emission layer 172 and the PDL 81.

However, in the present exemplary embodiment, unlike the first exemplary embodiment, the common electrode 173 does not cover the heat conductive layer 80 formed on the driving driver 33. Such a configuration may allow penetration of moisture, etc., through a side surface of the heat conductive layer 80. As illustrated in FIG. 4, the common electrode 173 is positioned on the driving driver 33. Thus, a driving load is suppressed. Therefore, suppression of moisture penetration and decrease of a driving load are in a trade-off relationship. In the present exemplary embodiment, in order to decrease the driving load, the common electrode 173 is formed to not cover the heat conductive layer 80.

According to the OLED display 101 of the present exemplary embodiment, by forming the heat conductive layer 80 and the second sealant 91, a driving failure is suppressed. In addition, heat dissipation efficiency may be improved.

According to the present exemplary embodiment, the OLED display 101 may be manufactured with a method similar to that of the OLED display 100. However, when forming the common electrode 173 of the organic light emitting element 170, the OLED display 101 is different from the OLED display 100 in that the heat conductive layer 80 is not covered, thereby decreasing the driving load.

In a conventional OLED display, an organic light emitting element is formed on a display substrate. When an organic light emitting element, made of an organic material, is coupled with moisture or oxygen, performance is deteriorated. Furthermore, driving elements of an organic light emitting element may cause a failure. The failure may be caused by penetration of moisture or oxygen. When a failure happens, the organic light emitting element cannot secure a sufficient lifespan.

In a conventional OLED display, as the OLED display becomes larger, heat generated in an organic light emitting element is increased. When heat generated within the organic light emitting display is not released efficiently, characteristics of the organic light emitting element may be changed. Thus, a driving failure may occur.

Therefore, development of an OLED display is required with a structure that can efficiently emit generated heat, while interrupting penetration of moisture and oxygen.

According to the present embodiments, an OLED display is provided having advantages of improving the lifespan of an organic light emitting element. Furthermore, penetration of moisture or oxygen into an organic light emitting element and a driving driver can be suppressed.

In addition, according to the present embodiments, the OLED display drives the organic light emitting element in a stable operation. Operation stability of an OLED display can be secured by effectively emitting heat generated in a driving driver.

According to the present embodiments, a method of manufacturing the OLED display is provided having advantages of manufacturing the OLED display with a simplified method. An OLED display that has excellent heat dissipation and a stable operation can be manufactured through a simple process change.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the inventive concept as set forth in the following claims.

What is claimed is:

1. An organic light emitting diode (OLED) display, comprising:
    a first substrate;
    a second substrate facing the first substrate;
    a thin film transistor on the first substrate in a display area;
    a driving driver on the first substrate in a non-display area;
    an organic light emitting element on the thin film transistor, the organic light emitting element including a pixel electrode, an organic emission layer, and a common electrode;
    a pixel defining layer (PDL) on the thin film transistor, the PDL exposing a part of the pixel electrode;
    a thermal conductive layer covering the driving driver, the thermal conductive layer and the PDL being made of the same material; and
    a first sealant between the first substrate and the second substrate, the first sealant along an outer edge of the first substrate and the second substrate.

2. The OLED display as claimed in claim 1, wherein the common electrode covers the PDL.

3. The OLED display as claimed in claim 2, further comprising:
    a second sealant covering the common electrode,
    the thermal conductive layer being between the first substrate and the second substrate.

4. The OLED display as claimed in claim 3, wherein the second sealant comprises an epoxy resin and a metal oxide, and
    the metal oxide is an oxide of any one of copper (Cu), aluminum (Al), silver (Ag), and iron (Fe).

5. The OLED display as claimed in claim 3, wherein the second sealant comprises an epoxy resin and talc.

6. The OLED display as claimed in claim 1, wherein the common electrode covers the PDL and the thermal conductive layer.

7. The OLED display as claimed in claim 6, further comprising a second sealant covering the common electrode, the second sealant between the first substrate and the second substrate.

8. The OLED display as claimed in claim 1, wherein the first sealant comprises an epoxy resin.

9. The OLED display as claimed in claim 1, wherein the second substrate is made of glass or metal.

10. A method of manufacturing an OLED display, the method comprising:
    forming a thin film transistor and a driving driver on a first substrate;
    forming a pixel electrode on the thin film transistor;
    forming a thermal conductive layer that covers the driving driver and a pixel defining layer (PDL) that exposes a part of the pixel electrode on the thin film transistor, the thermal conductive layer and the PDL being made simultaneously of the same material;
    forming an organic emission layer on the pixel electrode;
    forming a common electrode to cover the PDL and the organic emission layer;
    applying a first sealant along an outer edge of the first substrate; and
    bonding the first substrate and a second substrate through the first sealant.

11. The method as claimed in claim 10, further comprising:
    applying a second sealant after applying the first sealant, the second sealant covering the common electrode and the thermal conductive layer.

12. The method as claimed in claim 11, wherein the second sealant includes:
    an epoxy, and
    the epoxy includes talc or a metal oxide,
    the metal oxide being an oxide of any one of copper (Cu), aluminum (Al), silver (Ag), and iron (Fe).

13. The method as claimed in claim 12, further comprising thermosetting the second sealant.

14. The method as claimed in claim 10, wherein the common electrode is formed to cover the thermal conductive layer.

15. The method as claimed in claim 14, further comprising:
    applying a second sealant after applying the first sealant, the second sealant covering the common electrode.

16. The method as claimed in claim 10, wherein the first sealant includes an epoxy resin.

17. The method as claimed in claim 16, further comprising ultraviolet (UV) curing the first sealant.

18. The method as claimed in claim 10, wherein the second substrate is made of glass or metal.

* * * * *